United States Patent [19]

Ciszek

[11] Patent Number: 4,652,332

[45] Date of Patent: Mar. 24, 1987

[54] METHOD OF SYNTHESIZING AND GROWING COPPER-INDIUM-DISELENIDE (CUINSE$_2$) CRYSTALS

[75] Inventor: Theodore F. Ciszek, Evergreen, Colo.

[73] Assignee: The United States of America as represented by the United States Department of Energy, Washington, D.C.

[21] Appl. No.: 676,343

[22] Filed: Nov. 29, 1984

[51] Int. Cl.$^4$ .................. C30B 15/00; C30B 27/02
[52] U.S. Cl. ........................ 156/607; 156/617 SP; 156/DIG. 76
[58] Field of Search ............ 156/607, 617 SP, 617 R, 156/416 R, DIG. 76

[56] References Cited

U.S. PATENT DOCUMENTS 4,083,748 4/1978 Fault ..................... 156/DIG. 72
4,303,464 12/1981 Suzuki et al. .............. 156/617 SP

FOREIGN PATENT DOCUMENTS 137887 10/1979 Fed. Rep. of Germany ...... 156/607
5912638 3/1984 Japan ............................ 156/607

OTHER PUBLICATIONS

J. B. Mullin et al, "Liquid Encapsulation Crystal Pulling at High Pressures", Journal of Crystal Growth, 1968, pp. 281–285.
Metz et al, "A Technique for Pulling Single Crystals of Volatile Materials", Journal of Applied Physics 6/62, pp. 2016–2017.

Primary Examiner—S. Leon Bashore
Assistant Examiner—Michael K. Boyer
Attorney, Agent, or Firm—Michael J. Higgins; Kenneth L. Richardson; Judson R. Hightower

[57] ABSTRACT

A process for preparing CuInSe$_2$ crystals includes melting a sufficient quantity of B$_2$O$_3$ along with stoichiometric quantities of Cu, In, and Se in a crucible in a high pressure atmosphere of inert gas to encapsulate the CuInSe$_2$ melt and confine the Se to the crucible. Additional Se in the range of 1.8 to 2.2 percent over the stoichiometric quantity is preferred to make up for small amounts of Se lost in the process. The crystal is grown by inserting a seed crystal through the B$_2$O$_3$ encapsulate into contact with the CuInSe$_2$ melt and withdrawing the seed upwardly to grow the crystal thereon from the melt.

6 Claims, 6 Drawing Figures

METHOD OF SYNTHESIZING AND GROWING COPPER-INDIUM-DISELENIDE (CUINSE$_2$) CRYSTALS

CONTRACTUAL ORIGIN OF THE INVENTION

The United States Government has rights in this invention under Contract No. DE-AC02-83CH10093 between the U.S. Department of Energy and the Solar Energy Research Institute, a Division of Midwest Research Institute.

BACKGROUND OF THE INVENTION

1. Field of the Invention

The present invention is related generally to preparation of copper-indium-diselenide CuInSe$_2$ crystals, and more specifically to an improved method for preparing stochiometric high quality CuInSe$_2$ crystals in an open-topped crucible under pressure.

2. Description of the Prior Art

Copper-indium-diselenide (CuInSe$_2$) crystals are of interest in the semiconductor industry as potential semiconductor material, especially for heterojunction type semiconductors, although the full extent of their potential is not presently known. Presently known processes for producing CuInSe$_2$ crystals are cumbersome and totally inadequate for any efficient, large-scale production. Consequently, research and development efforts relating to testing and potential uses of CuInSe$_2$ crystals are inhibited by excessive cost and lack of readily available crystals.

In order to produce the crystals, copper (Cu), indium (In), and selenium (Se) have to mixed together at a high temperature of approximately 1000° C. to 1100° C., which is just above the 986° C. melting point of CuInSe$_2$. One of the significant problems is that Se becomes volatile and begins to vaporize quite rapidly at about 700° C. to 750° C., and it has a very high vapor pressure. Therefore, something has to be done to control the Se vapor and hold it in the presence of the Cu/In melt for a sufficient period of time during synthesis of the compound CuInSe$_2$.

The conventional method of preparing CuInSe$_2$ crystals involves a synthesis of the Cu, In, Se elements in a melt that occurs inside a vacuum sealed tube. The process essentially involves melting a mixture of Cu and In and exposing this melt to Se vapor for a sufficient period of time to allow a synthesis of these elements, and then cooling the melt to grow the crystals, all of which occurs in the vacuum sealed tube.

More specifically, chunks of the desired amounts of Cu and In are mixed in an elongated quartz crucible or "boat", and the crucible is positioned near the closed end inside an elongated quartz tube. A semiporous plug is then positioned in the tube to separate the interior of the tube into two chambers with the crucible of Cu and In in one chamber. The desired quantity of Se is measured into a quartz flask, which is then placed into the second chamber of the tube. The tube is then evacuated and sealed, usually by melting the open end of the tube and pulling the softened quartz closed.

Finally, heating coils are positioned around the tube. There is preferably one heating coil around the portion of the tube that houses the first chamber and contains the crucible of Cu and In, and a second, separately controlled, heating coil is positioned around the portion of the tube that houses the second chamber and contains the flask of Se. However, even though it would be desirable to be able to heat the crucible and the flask independent of each other, their close proximity makes that feat virtually impossible. Therefore, the Se usually vaporizes before the Cu and In reach their melting points. However, the semiporous plug between the crucible and flask tends to retard the migration of Se from the flask to the crucible until the vapor pressure increases sufficiently to force the Se through the plug. Then, the semiporous plug tends to feed the Se vapor slowly to the crucible where it synthesizes with the Cu/In melt.

The melt temperature is held for a period of time, usually in the range of one to ten hours, in order to complete the synthesis. Then, the elongated crucible is preferably cooled slowly from one end to the other in an attempt to grow the CuInSe$_2$ crystal from one end of the crucible to the other. Such preferential cooling can be attempted by sliding the tube longitudinally in relation to the heating coil.

While this conventional method is somewhat effective for preparation of semicrystalline growth, it is quite crude, labor intensive, and not very conducive to quality control, particularly of preferential cooling. Further, there is no convenient way to insert a seed crystal into the melt to grow a single crystal either by slow cooling or by Czochralski pulling. Therefore, it is practically impossible to obtain a large single crystal of CuInSe$_2$ with this method.

Sometimes a larger single crystal can be obtained by breaking the tube to recover the polycrystalline CuInSe$_2$ from the crucible, placing it in a different, second elongated vertical crucible, placing this second crucible in a vertical quartz tube, evacuating and sealing the tube, and heating the polycrystalline CuInSe$_2$ to a melt. Then the melt is preferantially cooled from the bottom to the top, which sometimes results in growth of a fairly large single crystal. Even this extra step, however, does not always result in growth of a single large crystal. Regional temperature control precise enough to preferentially cool from the bottom of the melt to the top is still a problem, and sometimes reaction between the melt and the crucible prevents single crystal growth. The high vapor pressure of the Se also causes this method to be somewhat dangerous in that these closed tubes or ampoules are subject to breakage.

In 1962, a technique for pulling single crystals from a melt of PbTe and PbSe covered with molten B$_2$O$_3$ in a relatively low pressure environment was published by E. P. A. Metz, R. C. Miller, and R. Mazelsky in the *Journal of Applied Physics*, Vol. 33, No. 6, p. 2016. This technique was advanced to crystal pulling in high pressures by J. B. Mullin, R. J. Heritage, C. H. Holliday, and B. W. Straughan, as published in 1968 in the *Journal of Crystal Growth*, Vol. 3, No 4, p. 281, where it was used to pull InP and GaP crystals. Pressures in the range of 25 to 40 atmospheres were used. However, those authors reported problems with contamination of the crystalline structures by the crucible materials made of silica and vitreous carbon. They also reported problems with boron contamination from the B$_2$O$_3$ encapsulating material.

CuInSe$_2$ crystals present even more difficult problems because Se has such a high vapor pressure or volatility, and the materials are very reactive. Further, CuInSe$_2$ has complex phase ordering transitions in the cooling and crystal growth process that are not present for the crystals discussed above. These extreme characteristics of CuInSe$_2$ have caused persons skilled in this art to be quite skeptical of the applicability of the liquid encapsulation techniques described above and to generally discount those techniques for any CuInSe$_2$ crystal growth process. Consequently, use of the conventional vacuum sealed ampoules for synthesizing CuInSe$_2$ crystals has persisted to the present time, in spite of the disadvantages described above.

SUMMARY OF THE INVENTION

Accordingly, it is a general object of the present invention to provide a new and improved method of preparing stochiometric high quality CuInSe$_2$ crystals.

It is a specific object of this invention to provide an improved method of preparing CuInSe$_2$ crystals without the use of vacuum sealed ampoules.

It is another specific object of the present invention to provide an improved method of seeding CuInSe$_2$ crystal growth from a melt.

A further specific object of the present invention is to provide an improved method of cooling melt-grown CuInSe$_2$ crystals through the complex sphaleritic and chalcopyrite phase ordering transitions unique to this material without fissions or fractures.

Additional objects, advantages, and novel features of the present invention shall be set forth in part in the description that follows, and in part will become apparent to those skilled in the art upon examination of the following or may be learned by the practice of the invention. The objects and advantages of the invention may be realized and attained by means of the instrumentalities and in combinations particularly pointed out in the appended claims.

To achieve the foregoing and other objects and in accordance with the purpose of the present invention, as embodied and broadly described herein, the method of this invention comprise the steps of placing stoichiometric quantities on Cu, In, and Se in a refractory crucible, with B$_2$O$_3$ over the Cu, In, and Se in a sufficient quantity that when B$_2$O$_3$ melts, it will cover and encapsulate the Cu, In, and Se in the crucible with at least 2 mm of B$_2$O$_3$. The crucible is then placed in a chamber with an inert environment, such as argon, which is pressurerized to about 55 to 70 atmospheres. The crucible and its contents is then heated to about 1000° to 1100° C. to melt and react the contents of the crucible and is held at that temperature under 55 to 70 atmospheres pressure for several hours to synthesize and homogenize the CuInSe$_2$ melt.

At this point, the crystal structure of CuInSe$_2$ can be grown in two ways. For directional solidification or Bridgeman/Stockbarger-type growth, the temperature is lowered slowly. The crucible is designed in a way such that a partially melted seed crystal is present at the cool end to initiate single crystal growth. If a single crystal structure is required, the rates should be in the range of about 5° C./h. to obtain proper ordering through the sphaleritic and chalcopyrite phases. If only a synthesized product is desired, the cooling rate can be faster.

For Czochralski growth, a seed crystal is inserted through the B$_2$O$_3$ to contact the CuInSe$_2$ melt. The melt temperature is adjusted until crystal growth occurs on the seed. The seed is then raised upward, with rotation, at a speed of not more than 10 mm/h. to grow the crystal.

BRIEF DESCRIPTION OF THE DRAWINGS

The accompanying drawings, which are incorporated in and form a part of the specifications, illustrate a preferred embodiment of the present invention, and together with the description serve to explain the principles of the invention. In the drawings.

DETAILED DESCRIPTION OF THE PREFERRED EMBODIMENTS

Figure 1:
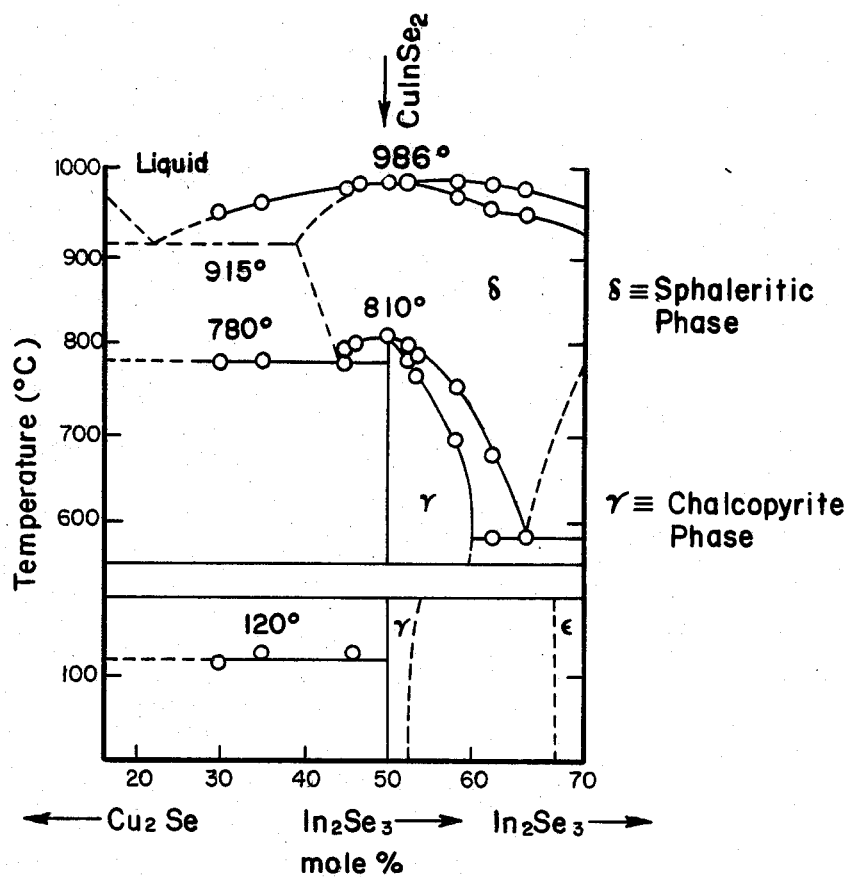
FIG. 1 is a phase diagram of CuInSe$_2$.
Figure 2:
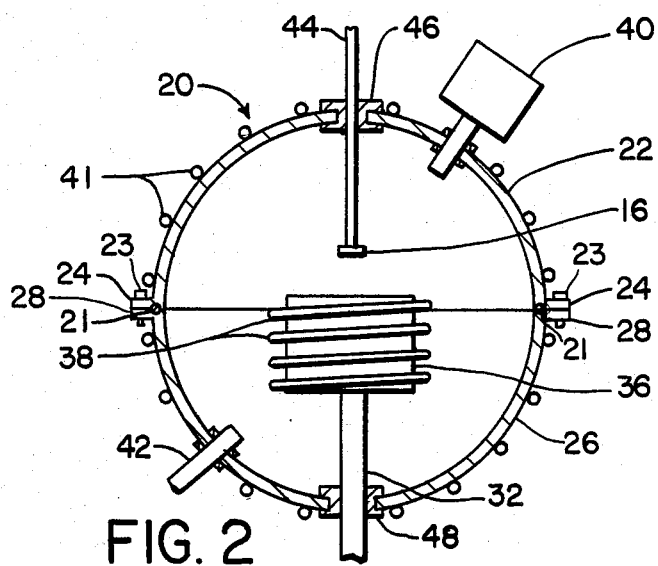
FIG. 2 is a cross-sectional view in elevation of a pressure chamber used to synthesize CuInSe$_2$ and grow CuInSe$_2$ crystals according to the present invention.

CuInSe$_2$ crystals are very difficult to form for several reasons, including the high vapor pressure of the Se and the complex phase ordering transitions characteristic of this compound. The phase diagram in FIG. 1 for CuInSe$_2$ shows a critical phase ordering transition zone near 810° C. that requires particular attention in preparing CuInSe$_2$ crystals. As the crystal cools from the melting point to 810° C., it has a sphalerite structure. Phase ordering occurs at 810° C., changing the crystal structure to a chalcopyrite phase. Some people also think there might be a second phase ordering at 665° C. (not shown in FIG. 1). The chalcopyrite phase is the stable form at room temperature. If the temperature drop is too fast or fluctuates through these transition zones or other conditions of pressure or composition are not right, the crystal lattice will not form correctly for a single crystal fissure-free structure.

Apparatus used in practicing the method of this invention are illustrated in FIGS. 2–6. The apparatus generally includes a hollow pressure chamber 20, essentially comprised of a top half or cover 22 and a lower half or container 26. The flange 24 around the open edge of cover 22 is adapted to engage with a similar flange 28 around the upper open edge of container 26. An O-ring seal 21 is positioned between the two flanges before they are tightened together with bolts 23. When so assembled, the interior of chamber 20 is adapted to contain very high pressures.

Inside the chamber 20, a crucible holder 34 is positioned on a rotatable pedestal 32, which extends downwardly through a seal 48 and the container 26. The crucible holder 34 is surrounded by an insulator sleeve 36, and a radio frequency (r.f.) induction heating coil 38 is positioned around the outside of the insulator sleeve 36.

A pulling rod 44 extends downwardly through a seal 46 in the top of the cover 22 to a position above the crucible holder 34. A closed circuit television camera 40 is also positioned in the cover 22 for monitoring the melt and crystal growth. An inlet tube 42 is provided for pumping inert gas, such as helium, under a high pressure into the chamber 20 for pressurizing the chamber.

Figure 3:
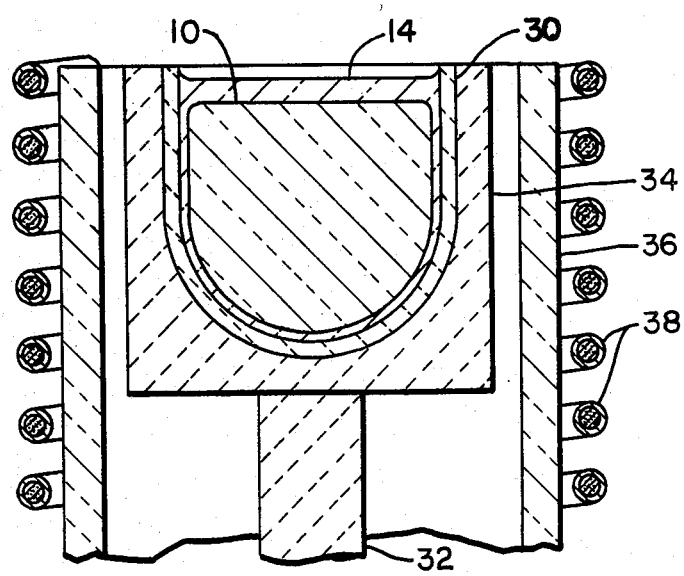
FIG. 3 is an enlarged cross-sectional view in elevation of the encapsulated melt of CuInSe$_2$.

Referring now primarily to FIG. 3, a crucible 30 is positioned in the crucible holder 34. At the start of this procedure, measured amounts of Cu, In, and Se are placed in the crucible, as required for stochiometric crystal growth. Essentially these proportions are 25% copper, 25 percent indium, and 50 percent selenium. However, as described below, this method can include the addition of slightly more Se to make up for selenium lost in the process. Then, a sufficient quantity of boric oxide ($B_2O_3$) for forming a layer at least 2 mm, and preferably in the range of 8 mm thick is placed over the Cu, indium and selenium in the crucible 30.

The crucible 30 with the copper, In and Se, and $B_2O_3$ therein is placed in the crucible holder 34 in the chamber 20. The cover 22 is positioned on and fastened to the lower container portion 26 with the flange bolts 23.

When the chamber 20 is assembled and sealed as described above, an inert gas, such as argon, is pumped through the inlet 42 into the chamber 20 to a pressure in the range of 55 to 75 atmospheres. After the chamber has been pressurized in this manner, the r.f. induction heating coil is turned on to heat the Cu, In, Se, and $B_2O_3$.

As the temperature rises, the $B_2O_3$ begins to soften at approximately 700° C., and covers the Cu, In, and Se in the crucible thereunder. In the range of 700° C. to 750° C., the Se starts to vaporize significantly. However, since the $B_2O_3$ is quite soft and nearly melted at that point, most of the selenium is confined within the crucible 30. The $B_2O_3$ in this temperature range ultimately melts and forms a liquid pool or encapsulate 14 as shown in FIG. 3, which covers the contents of the crucible with a layer preferably about 8 mm thick and wets the inside surface of the crucible.

Finally, at about 986° C., the Cu, In, and Se in the crucible 30 form a melt 10 of $CuInSe_2$ within the $B_2O_3$ encapsulate 14 along with some vaporizing Se. It is usually preferred that the temperature be raised above the 986° C. melting point of $CuInSe_2$, usually to the range of approximately 1000° C. to 1100° C. The melt 10 encapsulated in the $B_2O_3$ 14 under the pressure of 55 to 70 atmospheres of argon is held at this elevated temperature in the range of 1,000° to 1,100° C. for approximately two hours or longer to allow a complete synthesis and homogenization of the $CuInSe_2$ in the crucible 30.

At this point, there are two different methods of preparing the crystalline structure. In a first method, a directional solidification or Bridgman/Stackbarger-type growth, the temperature of the system can be lowered so that the temperature of the melt 10 drops below the 986° C. melting point and begins to form the crystalline structure in the crucible 30. As mentioned above, the solid-state phase ordering transition of the compound near 810° C. is very complex. Therefore, a very controlled rate of decrease in temperature is required through this transition and again through the 665° C. transition in order to form a good quality, single crystal structure by the directional solidification or Bridgman/Stackbarger-type growth method. Otherwise, the phase ordering or structuring within this critical phase will not be completed properly, and fissures or cracks will result. It has been found that lowering the temperature slowly at a rate of approximately 5° C. per hour or less can bring the compound through these critical phases with the materials properly ordered in a single crystal structure. Of course, if only a synthesized product is needed, rather than a single crystal structure, the cooling rate can be faster.

Figure 4:
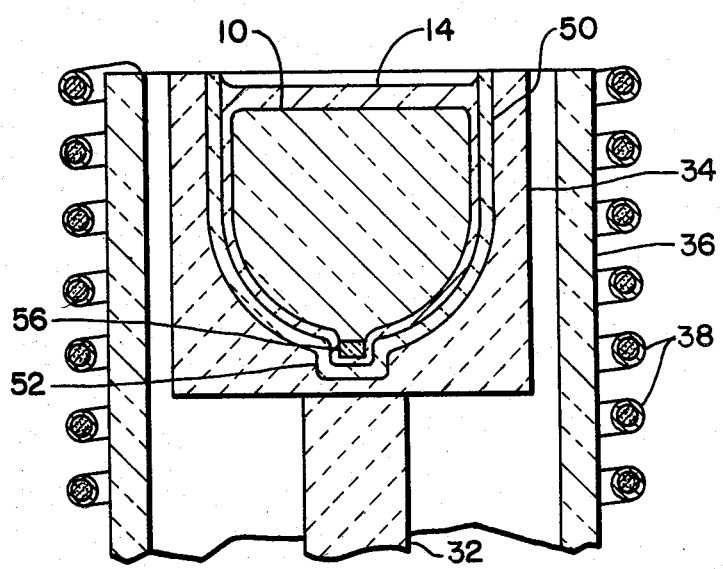
FIG. 4 is a similar view to that in FIG. 3 with a modified crucible having a seed pocket in the bottom.

A modification of this directional solidification growth process is illustrated in FIG. 4, wherein a modified crucible 50 has a seed pocket 52 in the bottom. A $CuInSe_2$ seed crystal is placed in this pocket 52 before the other constituent materials are placed in the crucible. This seed crystal provides a lattice structure on which the melt 10 can grow as a crystal during cooling.

Figure 5:
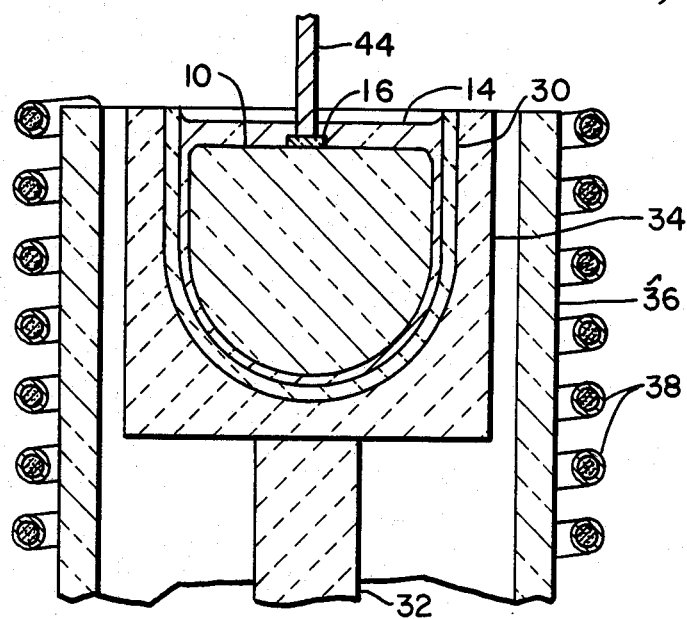
FIG. 5 is a similar view to that in FIG. 3, showing a rod above the crucible for inserting a seed crystal.
Figure 6:
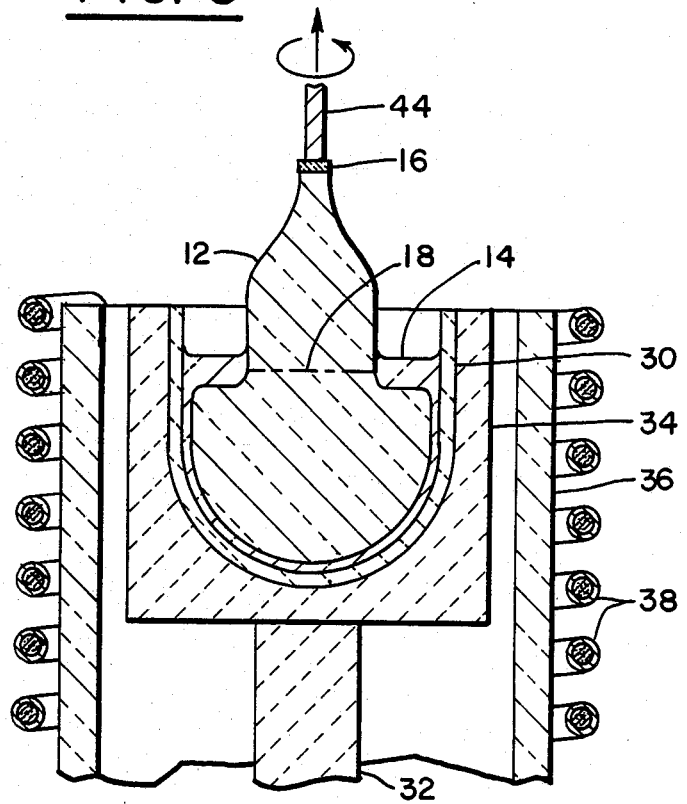
FIG. 6 is a view similar to that in FIG. 5 showing the single crystal ingot being pulled from the melt.

Another method for preparing the crystals is essentially a Czochralski growth method. Under this method, as illustrated in FIG. 5, the rod 44 with the $CuInSe_2$ seed crystal 16 attached thereto is lowered through the liquid $B_2O_3$ encapsulate 14 into contact with the $CuInSe_2$ melt. Then, the melt temperature is adjusted slowly downwardly until crystal growth occurs on the seed. At that point, slow rotation and axially upward motion of the rod 44 and seed 16 is begun. This rotational upward movement of the seed 16 results in a large cylindrical single crystal ingot 12 growing out of the melt 10. This growth occurs through the $B_2O_3$ encapsulate layer 14 as shown in FIG. 6.

It has been found that good growth of a $CuInSe_2$ crystal 12 can be attained by raising the seed at a speed of no more than 10 mm per hour. As the crystal grows at approximately the region indicated by the phantom line 18 in FIG. 6, this pull rate of approximately 10 mm per hour or less allows the $CuInSe_2$ compound to go slowly enough through the sphaleritic-to-calcopyrite phase transitions to result in good quality single crystalline growth.

Contrary to the prevailing wisdom of persons skilled in the art prior to this invention, the $B_2O_3$ in this invention is completely inert in relation to the $CuInSe_2$ so that there is no $B_2O_3$ contamination of the crystalline structure. Further, while quartz is a preferred material for the crucible 30, quartz can be slightly reactive with $CuInSe_2$ as mentioned above. However, the $B_2O_3$ encapsulate 14, as shown in FIGS. 3 and 4, completely surrounds the melt 10 including a layer of $B_2O_3$ between the melt 10 and the crucible as well as on top of the melt. Consequently, this $B_2O_3$ coating or encapsulate 14 prevents any reaction between the $CuInSe_2$ melt 10 and the quartz crucible 30.

Other crucible materials, such as vitreous carbon and boron nitride, can also be used. However, as discussed above, prior art experiments with other crystal materials had indicated some potential for contamination by vitreous carbon crucibles.

As mentioned above, the $B_2O_3$ encapsulate 14 in combination with the 55 to 70 atmosphere pressure over the $B_2O_3$ is quite effective for controlling or holding the highly volatile Se in the melt 10. However, it has been found that there is still some minute loss of Se in this process from the crucible that can prevent Stoichiometric crystal growth. To solve this problem, it has been found that the addition of approximately 1.8 to 2.0 percent additional Se in the crucible 30 can compensate for this loss and provide adjusted end conditions for Stoichiometric crystal growth.

The foregoing is considered as illustrative only of the principles of the invention. Further, since numerous modifications and changes will readily occur by those skilled in the art, it is not desired to limit the invention to the exact construction and operation shown and described, and accordingly, all suitable modifications and equivalents may be resorted to falling within the scope of the invention as defined by the claims which follow.

The embodiments of the invention in which an exclusive property or privilege is claimed are defined as follows:

1. The process of preparing a $CuInSe_2$ crystal substantially free of fissures, cracks and contamination from $B_2O_3$ and $SiO_2$, said process comprising the steps of:

placing stoichiometric quantities of Cu, In, and Se in a refractory quartz crucible;

placing a sufficient quantity of $B_2O_3$ in the crucible over the Cu, In, and Se to completely surround the Cu, In, and Se when melted to a liquid and to substantially prevent a reaction between said $CuInSe_2$ crystal and said quartz crucible;

placing said crucible containing said Cu, In, Se, and $B_2O_3$ in an enclosed chamber;

creating an environment of inert gas in the chamber and over the crucible and pressurizing this environment to a pressure substantially above the vapor pressure of Se at a selected operating temperature;

heating the crucible and its contents to an operating temperature range of about 1000° to 1100° C. to melt the contents of the crucible, and holding this temperature for a sufficient period of time to synthesize and homogenize the $CuInSe_2$ melt;

inserting a seed crystal of $CuInSe_2$ through the $B_2O_3$ surrounding material into contact with the $CuInSe_2$ melt;

adjusting the temperature of the $CuInSe_2$ melt to a temperature at which the $CuInSe_2$ crystal structure begins to grow on the seed crystal; and slowly pulling the seed crystal upwardly from the melt at a suitable speed for effecting continuous and complete lattice growth through the sphalerite and chalcopyrite phases of a said crystal so as to obtain said $CuInSe_2$ crystal substantially free of said fissures, cracks and contamination of $B_2O_3$ and $SiO_2$.

2. The process of claim 1, including the step of pressuring the environment to the range of 55 to 70 atmospheres.

3. The process of claim 1, including the step of rotating the seed crystal as it is pulled upwardly from the melt.

4. The process of claim 1, including the step of pulling the seed crystal upwardly from the melt at a rate not greater than 10 mm/h.

5. The process of claim 1, including the step of adding up to 3% additional Se over the stoichiometric quantity to the crucible.

6. The process of claim 1 including the step of placing a sufficient quantity of $B_2O_3$ in said crucible to form a layer surrounding the Cu, In, and Se at least 2 mm thick.

* * * * *